United States Patent [19]

Björkman

[11] Patent Number: 4,688,874

[45] Date of Patent: Aug. 25, 1987

[54] ARRANGEMENT IN ELECTRIC DISCHARGE LAMPS

[75] Inventor: Ake Björkman, Karlskrona, Sweden

[73] Assignee: Lumalampan Aktiebolag, Sweden

[21] Appl. No.: 827,761

[22] Filed: Feb. 7, 1986

[30] Foreign Application Priority Data

Feb. 12, 1985 [SE] Sweden ........................ 85006484

[51] Int. Cl.[4] ........................................ H05K 1/00

[52] U.S. Cl. .................................. 439/56; 439/642; 439/646; 439/682

[58] Field of Search .............. 339/17 C, 17 D, 17 LC, 339/176 L, 154–156, 167, 168, 193 P, 193 VS, 50–56; 315/50–58; 313/493; 340/378

[56] References Cited

U.S. PATENT DOCUMENTS

| | | | |
|---|---|---|---|
| 2,812,471 | 11/1957 | Jarobe | 339/17 D |
| 3,662,381 | 5/1972 | Steffens | 340/378 |
| 4,383,200 | 5/1983 | Van Zon et al. | 315/57 |
| 4,389,595 | 6/1983 | Kamei et al. | 315/57 |
| 4,443,778 | 4/1984 | Mewissen | 336/90 |
| 4,449,071 | 5/1984 | Yokoyama | 315/53 |
| 4,495,443 | 1/1985 | Cummings | 315/58 |

FOREIGN PATENT DOCUMENTS 2132827 7/1984 United Kingdom .

*Primary Examiner*—Gil Weidenfeld
*Assistant Examiner*—David Pirlot
*Attorney, Agent, or Firm*—Roylance, Abrams, Berdo

[57] ABSTRACT

An adapter for connecting a compact gas vapor electric-discharge lamp to standardized incandescent lamp fittings. The adapter (11) comprises a coupling housing (12), a holder part (13) for the base (14) of the lamp, and a conventional incandescent-lamp base (15). The adapter has a basic form corresponding substantially to the lower part of a standard incandescent lamp. The upper part of the adapter is formed by the holder part (13), which presents a central recess (21) into which the base (14) of the lamp (17) can be inserted, and a reflective cover plate (22), which surrounds the recess (21). The ignition and drive circuits (16) of the electric-discharge lamp includes an electronic frequency converter for converting mains frequency to a high frequency. The constituent electrical components are incorporated both around the recess (21) and in the lamp base (15) and are mutually connected via a circuit card (18) arranged between these parts.

5 Claims, 9 Drawing Figures

ARRANGEMENT IN ELECTRIC DISCHARGE LAMPS

The present invention relates to an adapter for connecting compact electric discharge lamps to standardized incandescent lamp fittings, comprising a coupling housing having arranged thereon a conventional incandescent lamp fitting and a fluorescent-lamp holding element.

Compact electric discharge-lamps have been known to the art for some years. Such lamps, hereinafter referred to generally as fluorescent lamps, comprise tubular bulbs having a diameter of from 10–15 mm and carried by specially constructed bases. In order to obtain a lamp which is as compact as possible, the tubular bulbs are often given the shape of a single or double U. Fluorescent lamps of this kind are found described, for example, in European Patent Application No. 0061758 and the British Patent Application No. 2 077 488. These fluorescent lamps are now made so compact as to enable them to replace, beneficially, conventional incandescent lamps in various fields of application. Hitherto, however, it has been necessary in this respect to manufacture lamp fittings which are equipped with a specially construed holder, fully adapted to the respective bases of such fluorescent lamps, which has greatly limited their use. One form of fluorescent lamp, however, so-called SL-lamps, has been provided with a conventional base, as is disclosed in European Patent Application No. 0101013 for example. These lamps are expensive to purchase, however, since the ignition and drive circuits must be incorporated in the lamp, as opposed to conventional fluorescent lamps. The SL-lamps are also from fifteen (15) to twenty (20) times heavier than conventional fluorescent lamps and cannot therefore be used as a substitute for such lamps in mounts which are relative weak mechanically and sensitive to weight. It can thus be said in summary that the situation is one in which despite the fact that a luminescent lamp of the aforedescribed kind consumes only about a third of the input energy required by a conventional incandescent lamp to emit the same amount of light, fluorescent lamps have only captured a very small part of the total market pertaining to lighting apparatus.

Consequently, the prime object of the present invention is to enhanqe the possibility of using compact fluorescent lamps, i.e. compact electric-discharge lamps, by providing a separate adapter which can be coupled between the fluorescent lamp and the conventional lamp fitting provided. A further object is to provide an adapter which is so compact that the adapter together with the fluorescent lamp is sufficiently small to be accommodated in the space reserved in conventional incandescent-lamp mounts. Still another object is to provide an adapter which is so light in weight as to enable it to be readily fitted in existing mounts. These and other objects of the invention, together with advantages afforded thereby will be apparent from the following description, and are all achieved by the present invention.

The invention will now be described in more detail with reference to the accompanying drawings, in which.

Figure 1:
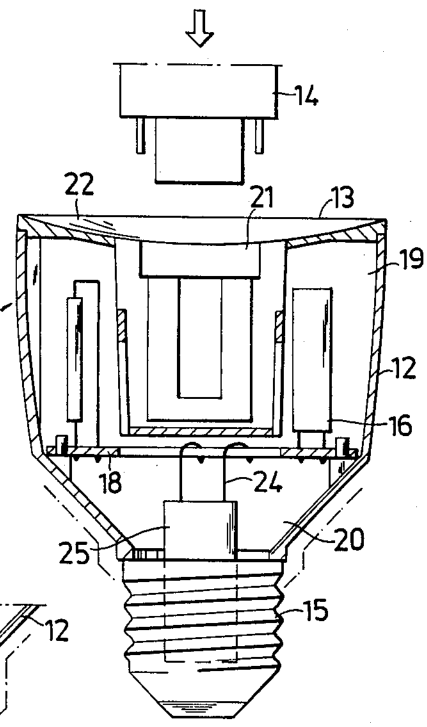
FIG. 1 is a side view, partly in section, of an adapter according to the invention.
Figure 5:
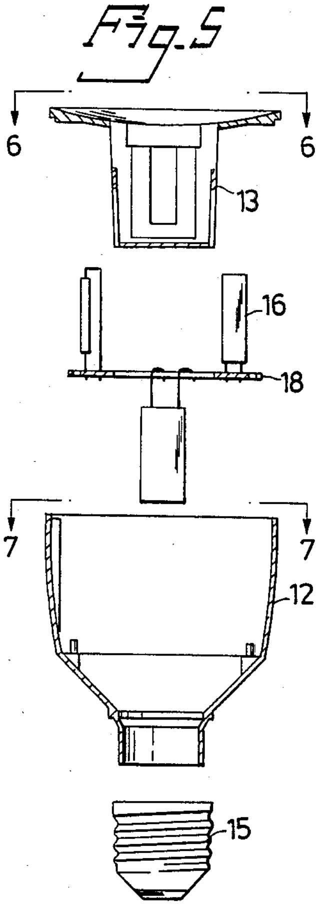
FIG. 5 is an exploded cross-sectional view of the component parts of the adpater illustrated in FIG. 1.
Figure 6:
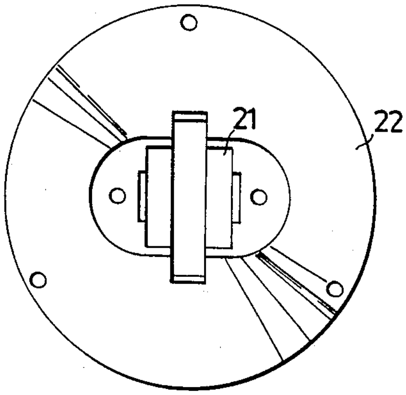
Figure 7:
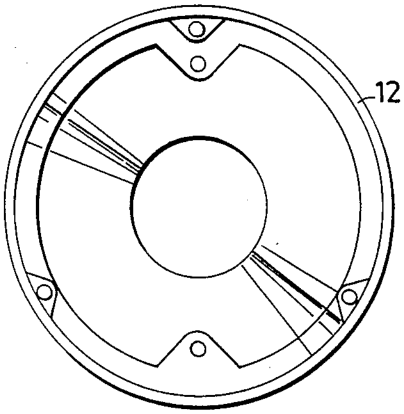
Figure 8:
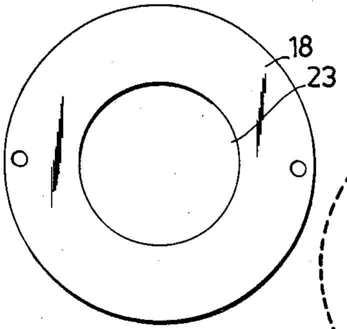
Figure 9:
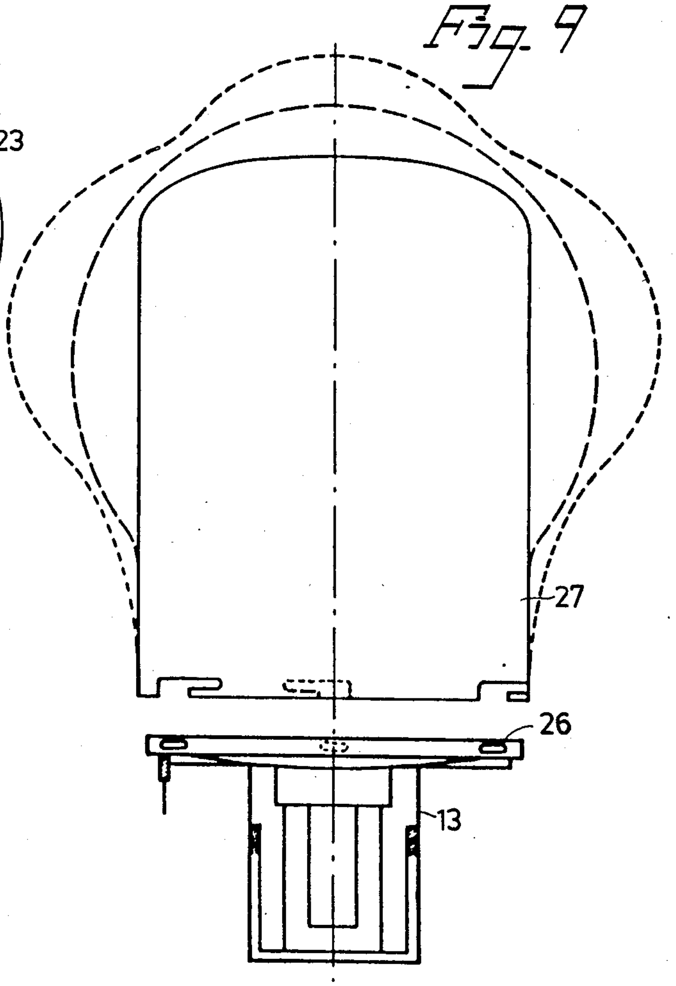

FIGS. 6 and 7 are views from above of the component parts illustrated in FIG. 5, these views being taken on the lines shown by respective arrows 6—6 and 7—7;

FIG. 8 is a plan view of a circuit card incorporated in the adapter illustrated in FIG. 1; and FIG. 9 is a side view of a lamp glass adapted to the adapter according to the invention.

The adapter 11 illustrated in FIG. 1 comprises a coupling housing 12, a holder part 13 for the lamp base 14 of the uminescent 1amp, and a standard incandescent lamp base 15. Also incorporated in the adapter are the electrical ignition and drive circuits 16 required for the normal function of the luminescent lamp. The drive circuit 16 includes a frequency converter of some suitable kind, by means of which the main frequency can be converted to a high frequency in the order of about 30,000 Hz. The circuits 16 can be constructed in a variety of ways, although all of such circuits will require the provision of a number of standard components, of which some are so bulky as to render them difficult to place. Some components, for example transistors, may also be so sensitive to heat as to prevent them being placed in the direct proximity of the fluorescent lamp 17. An example of components which must be found in a complete ignition and drive circuit includes a choke, a plurality of capacitors, two transistors, a plurality of resistors, and a transformer. In accordance with the present invention these components are all interconnected through a disc-shaped circular circuit card 18 mounted in the lower part of the coupling housing 12. The circuit card 18 divides the interior of the coupling housing 12 into a first space 19 located above the circuit card and a second space 20 located beneath the card. The first space 19 is also defined by the holder element 13, which presents a central recess 21 intended to accommodate the base 14 of the fluorescent lamp, and a concave, reflective cover 22, which forms the upper part of the adapter. The second space 20 is defined downwardly by the incandescent-lamp base 15 although, as shown in FIG. 1, certain other components can also be accommodated therein, suitably some larger capacitors and the heat-sensitive transistors. The frequency converter incorporated in the drive circuit enables the choke to be made much smaller and much lighter in weight than is normally the case, and may be included as a part in the circuit card. In addition, as a result of the high frequency used the energy losses are lower, thereby enabling the luminous efficiency to be increased by about 10%.

The disc-shaped circuit card 18 enables all components to be soldered securely to the card from one and the same side thereof, in a known manner. Certain components can then be bent down through a central opening 23 in the card, so as to be located in the second space 20. This is illustrated in FIG. 1 by the bent connecting wires 21 leading to a capacitor 25. This enables the circuits 16 to be placed in a highly efficient manner, at the same time as the circuits can be readily mounted in the adapter and, furthermore, the space therein is utilized to the full. Although the opening 23 is preferably formed in the center of the card 18, it may also be arranged in some other way, for example as a circle-segment in the card. The assembly procedure is seen most clearly from FIG. 5, which illustrates schematically how the component parts can be readily assembled together. The coupling housing 12 and the holder part 13 are made from some suitable insulating plastics material, and the cover 22 on the holder part is also made reflective in some suitable known manner. As illustrated in FIG. 9, the cover 22 may also be provided with attachment means 26 for the attachment of a circular or spherical or other shape lamp-glass or bulb 27 as indicated by the dashed lines, so that a complete lamp fitting can be provided.

Figure 2:
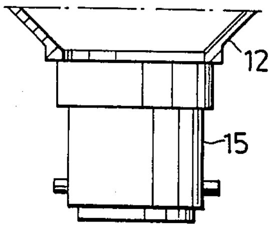
FIGS. 2 and 3 illustrate respectively the lower part of the adapters adapted to conform with a further two forms of standard lamp bases.
Figure 3:
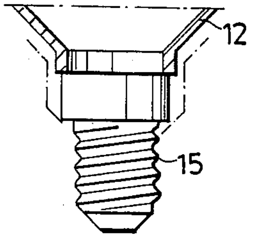
Figure 4:
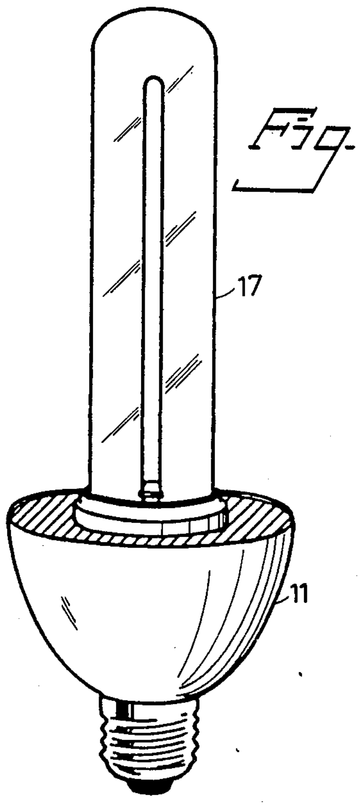
FIG. 4 is a perspective view of an adapter having a compact fluorescent lamp connected thereto.

A lamp assembly comprising a compact luminescent lamp 17 and an adapter 11 according to FIG. 4 is only negligibly longer (2–3 cm) than a conventional incandescent lamp of standard design. This enables the combination to be used in practically all existing fittings. The adapter, however, must naturally be modified to conform to the various different standard lamp bases available on the market. Examples of this are illustrated in FIGS. 2 and 3, which illustrate the adapter when fitted with a B22-base and and E14-base respectively. The conventional E27-base is illustrated in FIG. 1. When changing a lamp, only the fluorescent-lamp part 17 itself need be changed for another, while the adapter 11 can be left in its fitting. This is a great advantage, inter alia in relation to the so-called SL-lamps, which admittedly also have an incandescent-lamp base but which also have ignition and drive circuits incorporated in the lamp, and hence these components, which are still serviceable in themselves, must be discarded as scrap together with the luminescent lamp, which makes this type of lamp highly costly in continuous use. Since these lamps are also much heavier than conventional incandescent lamps and, moreover, have a larger diameter, they cannot be used in all lamp mounts. A lighting assembly comprising an adapter according to the invention and a conventional compact fluorescent lamp, for example Phillips PL-lamps, is, on the other hand, only negligibly larger than a conventional incandescent lamp and is only from five (5) to six (6) times heavier than such a lamp, which shall be compared with the weight of the aforesaid SL-lamps which is from fifteen (15) to twenty (20) times as great.

It will be understood that the invention is not restricted to the illustrated embodiments and that various modifications can be made within the scope of the following claims.

I claim:

1. An adapter for connecting a compact electric discharge lamp to a standard incandescent lamp fitting comprising a coupling housing; said adapter comprising a conventional an incandescent lamp base, a holder part for holding an electric discharge lamp, and drive circuit means including choke means adapted to produce normal functioning of the lamp; said lamp comprising a base, said holder part extending into the coupling housing and being formed with a central recess for accommodating the base of the lamp, said drive circuit means comprising frequency converter means for converting the frequency of the electrical main lines to a high frequency, a circuit card, means to mount the circuit card in the coupling housing such that the circuit card divides the coupling housing into a first space which overlies the circuit card and a second space which underlies said card, and means for mounting said frequency converter means and all of the drive circuit means including said choke in said housing interconnected through said circuit card such that the electric components are accommodated in both the first space and around the central recess of the holder part and in the second space and inside the conventional incandescent lamp base.

2. An adapter according to claim 1, wherein the circuit card is circular.

3. An adapter according to claim 2, wherein the holder part is of circular cross-sectional shape and is so configured that a combination of said adapter and a compact discharge lamp can fit virtually all applications intended for a conventional incandescent lamp.

4. An adapter according to claim 1, wherein a cover plate having a reflective outer surface is arranged to close off the space between the central recess of the holder part and the wall of the coupling housing.

5. An adapter according to claim 4, wherein the cover plate includes attachment means for the attachment of a lamp glass thereto.

* * * * *